(12) United States Patent
Cohen et al.

(10) Patent No.: US 9,095,056 B2
(45) Date of Patent: Jul. 28, 2015

(54) MODULE FOR USE WITH A MONITORING SYSTEM AND METHOD OF ASSEMBLING SAME

(75) Inventors: Mitchell Dean Cohen, Carson City, NV (US); Robert Ronald Nikkels, Gardnerville, NV (US); Sean Kelly Summers, Carson City, NV (US)

(73) Assignee: General Electric Company, Schenectady, NY (US)

( * ) Notice: Subject to any disclaimer, the term of this patent is extended or adjusted under 35 U.S.C. 154(b) by 474 days.

(21) Appl. No.: 13/462,568

(22) Filed: May 2, 2012

(65) Prior Publication Data
US 2013/0294036 A1 Nov. 7, 2013

(51) Int. Cl.
*H05K 1/14* (2006.01)
*H05K 1/02* (2006.01)

(52) U.S. Cl.
CPC ............ *H05K 1/0218* (2013.01); *H05K 1/0215* (2013.01); *Y10T 29/49117* (2015.01); *Y10T 29/49147* (2015.01)

(58) Field of Classification Search
CPC .. H05K 9/0039; H05K 9/0022; H05K 1/0218
USPC .......... 361/736, 800, 818; 174/371, 373, 377; 439/607.07
See application file for complete search history.

(56) References Cited

U.S. PATENT DOCUMENTS

| | | | |
|---|---|---|---|
| 6,780,030 B2 | 8/2004 | Yoshinaga et al. | |
| 6,799,902 B2 | 10/2004 | Anderson et al. | |
| 6,866,544 B1 * | 3/2005 | Casey et al. | 439/607.2 |
| 7,327,584 B2 * | 2/2008 | Ice | 361/816 |
| 7,433,203 B1 | 10/2008 | Yi et al. | |
| 7,738,262 B2 * | 6/2010 | Sato et al. | 361/816 |
| 7,957,806 B2 | 6/2011 | Stevenson et al. | |
| 7,981,730 B2 | 7/2011 | Tang et al. | |
| 8,095,224 B2 | 1/2012 | Truex et al. | |
| 8,110,441 B2 | 2/2012 | Chandra et al. | |
| 8,159,832 B2 | 4/2012 | Arslan et al. | |
| 2004/0136162 A1 | 7/2004 | Asai et al. | |
| 2005/0213309 A1 * | 9/2005 | Hiratsuka et al. | 361/816 |

* cited by examiner

*Primary Examiner* — Jayprakash N Gandhi
*Assistant Examiner* — Mukund G Patel
(74) *Attorney, Agent, or Firm* — Fletcher Yoder, P.C.

(57) ABSTRACT

A module for use with a monitoring system is provided. The module includes a circuit board that includes a plurality of ground planes. At least two of the plurality of ground planes are coupled using a plurality of vias. The module further includes a copper pour coupled to the circuit board adjacent to the plurality of vias. The module further includes a housing that includes a dam wall that is coupled to the copper pour.

17 Claims, 5 Drawing Sheets

MODULE FOR USE WITH A MONITORING SYSTEM AND METHOD OF ASSEMBLING SAME

BACKGROUND OF THE INVENTION

The present application relates generally to monitoring systems and, more particularly, to a monitoring system module including electromagnetic interference protection.

Known machines may exhibit vibrations or other abnormal behavior during operation. One or more sensors may be used to measure and/or monitor such behavior and to determine, for example, an amount of vibration exhibited in a motor drive shaft, a rotational speed of the motor drive shaft, and/or any other suitable operational characteristic of an operating machine or motor. Often, sensors are coupled to a monitoring system that includes a plurality of monitors. At least some known monitoring systems receive signals representative of measurements from one or more sensors, and in response, perform at least one processing step on the signals, prior to transmitting the modified signals to a diagnostic platform that displays the measurements to a user in a format usable by the user.

At least some known monitoring systems include at least one electrical bus within a system backplane that is used to couple the sensors to one or more monitors. High-speed monitors and/or backplanes may transmit one or more high-speed signals to each other. However, during transmission of such high-speed signals, unwanted electromagnetic radiation may be generated. Additionally, known monitoring systems may be susceptible to externally-generated electromagnetic radiation.

Accordingly, a monitoring system capable of reducing incoming and outgoing electromagnetic radiation is desirable. External metal shrouds and toroidal suppression are used with known systems to reduce electromagnetic radiation, however, an improved system that does not require external shrouds is desired.

BRIEF DESCRIPTION OF THE INVENTION

In one embodiment, a module for use with a monitoring system is provided. The module includes a circuit board that includes a plurality of ground planes. At least two of the plurality of ground planes are coupled using a plurality of vias. The module further includes a copper pour coupled to the circuit board adjacent to the plurality of vias. The module further includes a housing that includes a dam wall that is coupled to the copper pour.

In another embodiment, a monitoring system including a backplane and a module is provided. The module includes a circuit board that includes a plurality of ground planes. At least two of the plurality of ground planes are coupled using a plurality of vias. The module further includes a copper pour coupled to the circuit board adjacent to the plurality of vias. The module further includes a housing that includes a dam wall that is coupled to the copper pour.

In yet another embodiment, a method for assembling a module is provided. The method includes providing a circuit board that includes a plurality of ground planes, providing a copper pour on a surface layer of the circuit board, forming a fence using a plurality of vias that couple one or more of the plurality of ground planes, and coupling a housing adjacent to the circuit board, wherein the housing includes a dam wall.

DETAILED DESCRIPTION OF THE INVENTION

Figure 1:
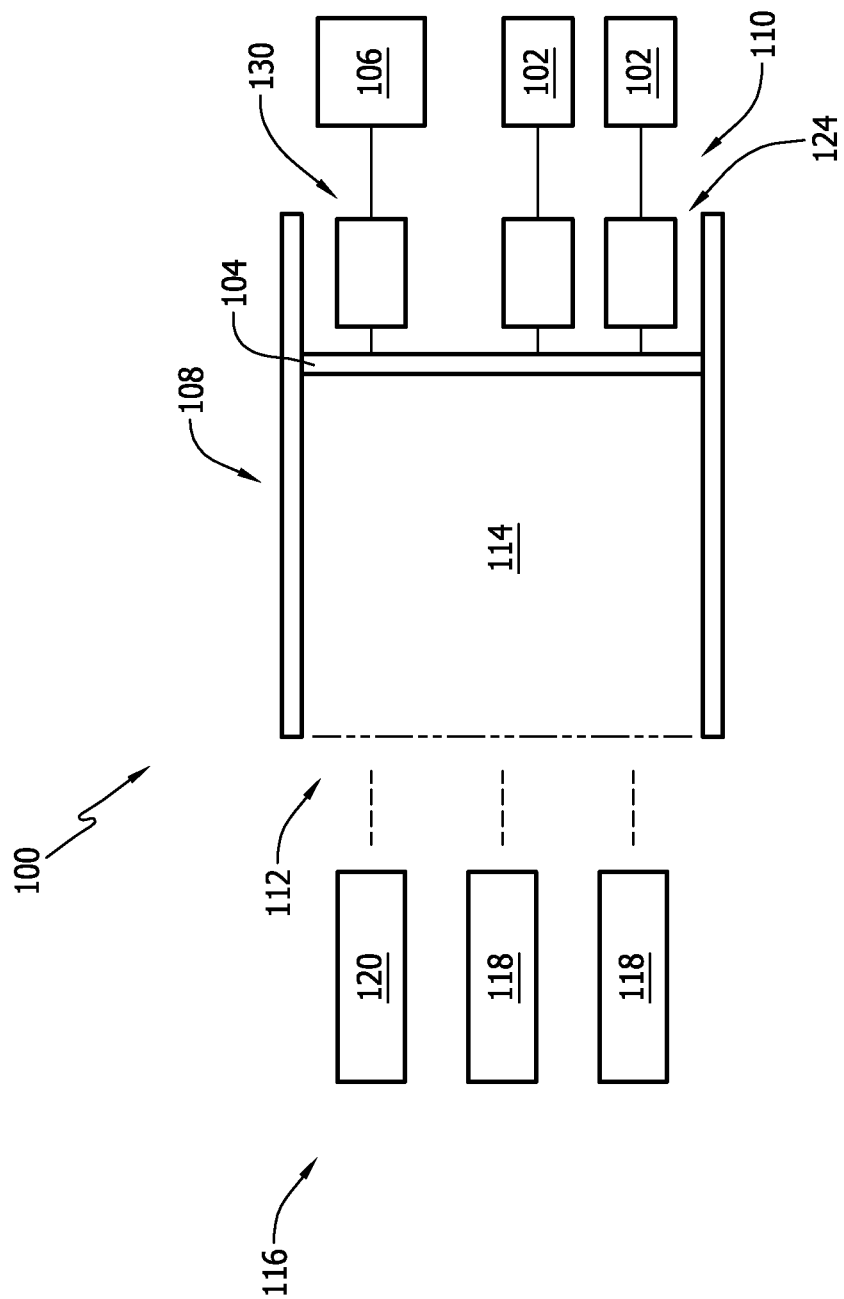
FIG. 1 is a schematic view of an exemplary monitoring system that may be used to monitor the operation of a machine.

FIG. 1 is a schematic view of an exemplary machine monitoring system 100 that may be used to monitor the operation of a machine (not shown). In the exemplary embodiment, monitoring system 100 monitors at least one operating condition of one or more machines using one or more transducers 102 or other sensors. More specifically, in the exemplary embodiment, a plurality of transducers 102 are coupled to a system backplane 104 that receives signals from transducers 102 that are indicative of measured and/or detected operating conditions of the machine and/or of one or more components of the machine. Moreover, in the exemplary embodiment, monitoring system 100 receives power from a power supply 106 coupled to system backplane 104. Alternatively, monitoring system 100 may receive power from any suitable power source that enables system 100 to function as described herein. In the exemplary embodiment, system backplane 104 includes a monitoring system bus (not shown in FIG. 1) that includes a plurality of conductors (not shown). As used herein, the term "couple" is not limited to a direct mechanical and/or an electrical connection between components, but may also be used to include an indirect mechanical and/or electrical connection between components.

In the exemplary embodiment, system backplane 104 is positioned within a housing 108. More specifically, in the exemplary embodiment, system backplane 104 is positioned in proximity to, or adjacent to, a rear portion 110 of housing 108. A front portion 112 of housing 108 is open to an external environment. Housing 108 includes a cavity 114 defined therein that extends inwardly from front portion 112.

Monitoring system 100, in the exemplary embodiment, includes at least one monitoring module 116. More specifically, in the exemplary embodiment, monitoring system 100 includes at least one transducer monitoring module 118 that processes at least one signal received from transducers 102. As used herein, the term "process" refers to performing an operation on, adjusting, filtering, buffering, and/or altering at least one characteristic of a signal. In the exemplary embodiment, monitoring system 100 includes any number of transducer monitoring modules 118 that enable system 100 to function as described herein. Each monitoring module 118 is coupled to system backplane 104 and is positioned at least partially within housing 108. As such, in the exemplary embodiment, signals from transducers 102 are transmitted to transducer monitoring modules 118 through system backplane 104. Moreover, in some embodiments, at least one signal may be transmitted between different transducer monitoring modules 118.

In the exemplary embodiment, monitoring system 100 also includes at least one system monitoring module 120 that is coupled to system backplane 104 and that is contained at least partially within housing 108. In the exemplary embodiment, system monitoring module 120 receives data and/or status signals transmitted from transducer monitoring modules 118 and/or from other components of monitoring system 100. Module 120 processes and/or analyzes the data and/or status signals prior to transmitting the signals to a remote system (not shown), such as a computer system, for display or output to a user.

In the exemplary embodiment, backplane 104 partially defines a cavity 124 that extends towards back portion 110. One or more input/output ("I/O") modules 130 are positioned at least partially within cavity 124. I/O modules 130 may be configured to communicatively couple power supply 106, and/or transducers 102 with backplane 104. Alternatively, or additionally, I/O modules 130 may communicatively couple any data and/or signal source and/or destination with backplane 104 and monitoring system 100. As cavity 124 may expose backplane 104 and/or modules 116 to an external environment, I/O modules 130 are configured to facilitate reducing the transmission of electromagnetic interference ("EMI"), or electromagnetic radiation, through cavity 124.

Figure 2:
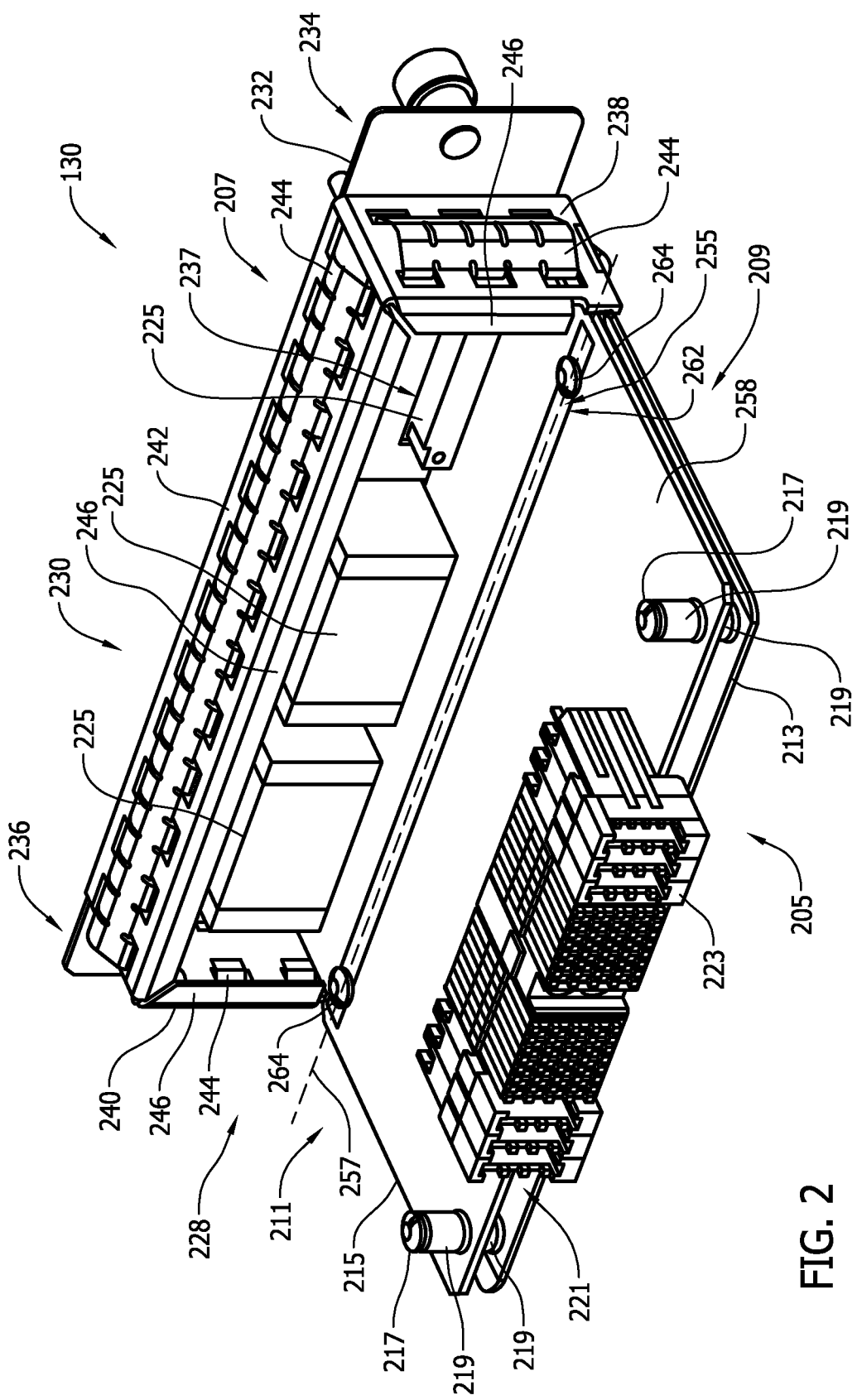
FIG. 2 illustrates an exemplary I/O module that may be used with the system in FIG. 1.
Figure 3:
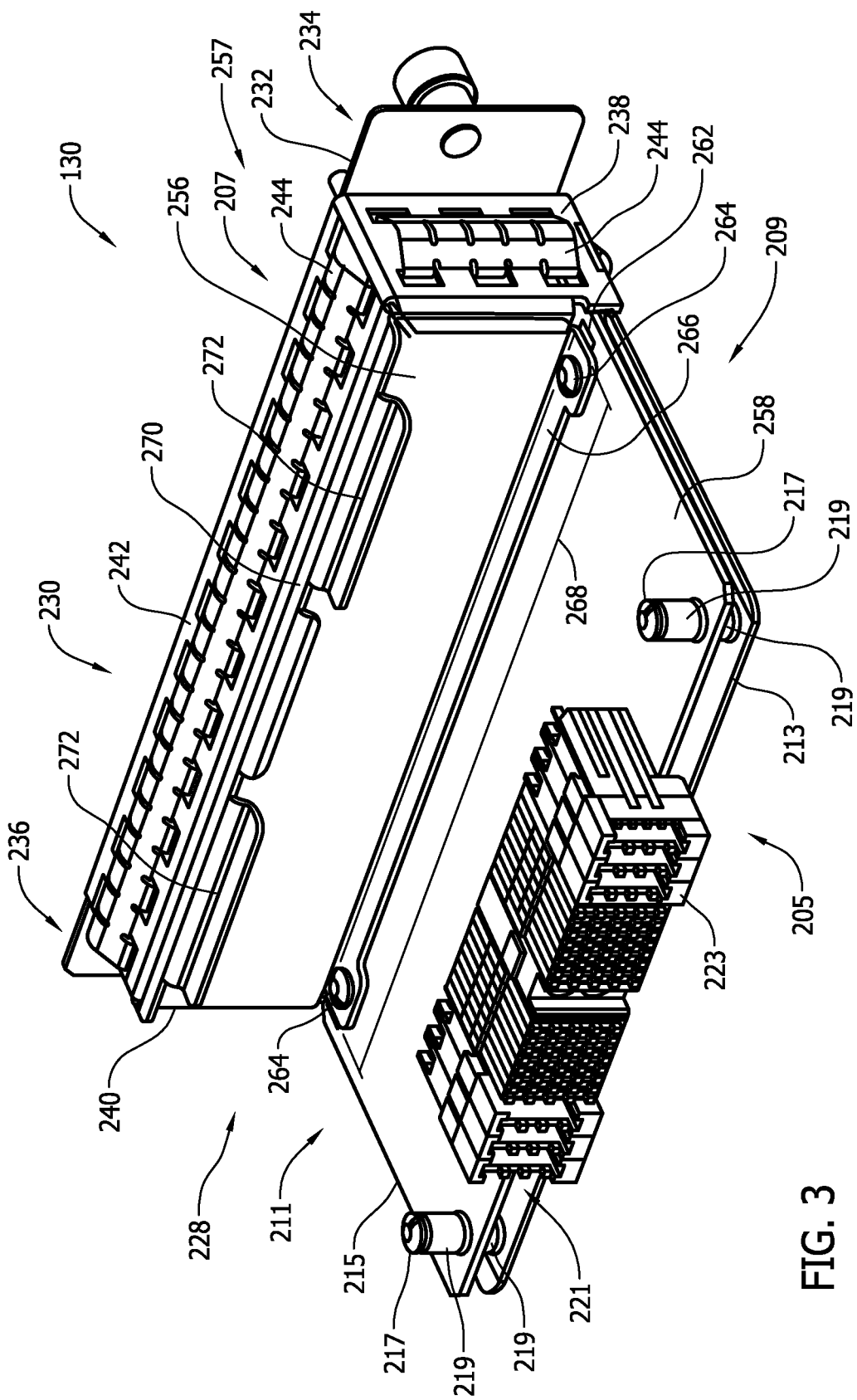
FIG. 3 illustrates an exemplary configuration of the I/O module in FIG. 2.

FIG. 2 illustrates an exemplary I/O module 130 that may be used with monitoring system 100. FIG. 3 illustrates an exemplary configuration of I/O module 130. Module 130 includes a front portion 205, a rear portion 207, a first side 209, and a second side 211. Module 130 includes a support wall 213 that extends from first side 209 to second side 211, and at least partially from front portion 205 towards rear portion 207. Module 130 includes a circuit board 215 that is coupled to wall 213 using at least one mechanical fastener 217 (e.g., a screw, a rivet, etc.) and at least one riser 219 (e.g., a gasket, a washer, etc.). Risers 219 enable an air gap 221 to be formed between circuit board 215 and wall 213.

A backplane connector 223 is coupled to circuit board 215 and is configured to communicatively couple circuit board 215 with backplane 104. At least one external connector 225 is coupled to circuit board 215 and is configured to communicatively couple circuit board 215 with power supply 106, transducers 102, and/or any other external input or output. For example, external connector 225 may include, but is not limited to, a screw terminal, a USB port, a serial port, a punch-down block, and/or any connector or interconnect that facilitates transmission of data, signals, and/or electricity with circuit board 215.

I/O module 130 includes an EMI dam 228 for reducing the transmission of EMI through monitoring system 100. EMI dam 228 includes a housing 230 coupled to wall 213 adjacent to rear portion 207. Housing 230 includes a rear wall 232 that is substantially perpendicular to wall 213. In the exemplary embodiment, rear wall 232 extends beyond housing 230 such that a first flange 234 and a second flange 236 are formed using rear wall 232. Flanges 234 and 236 include a mechanical fastener 238 (e.g., a thumb screw, etc.) for coupling module 130 to monitoring system 100. Rear wall 232 includes openings 237 to accommodate each external connector 225 that is positioned within housing 237.

Housing 230 includes a first side wall 238, a second side wall 240, and a transverse wall 242. Each wall 238, 240, and 242 includes one or more finger stock gaskets 244. Alternatively, zero, one, or two of walls 238, 240, and 242 include gaskets 244. In the exemplary embodiment, walls 238 and 240 are coupled to wall 213. Each wall 238, 240, and 242 includes a flange 246 that is substantially parallel to rear wall 232.

EMI dam 228 also includes a copper pour 255 (shown in FIG. 2) and a dam wall 256 (shown in FIG. 3). Copper pour 255 (shown in FIG. 2) is an area substantially filled with copper and is positioned along a transverse axis 257 of circuit board 215. More particularly, copper pour 255 fills a portion of a surface layer 258 of circuit board 215. Alternatively, copper pour 255 may be any material or combination of materials that enables EMI dam 228 to function as described herein. Circuit board 215 includes one or more ground plane layers (not shown) below surface layer 258.

Figure 4:
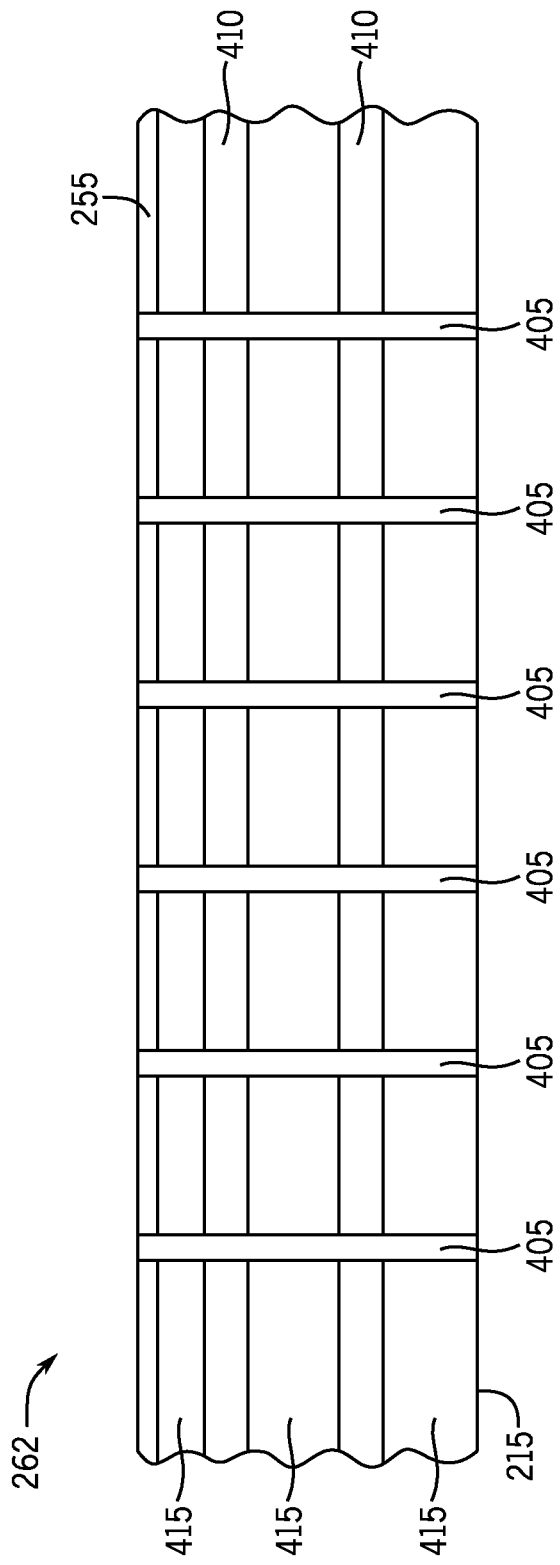
FIG. 4 is a cross-sectional view of an exemplary fence that may be used with the I/O module in FIG. 2.

EMI dam 228 also includes a fence 262 that extends from first side 209 to second side 211 along transverse axis 257. FIG. 4 is a cross-sectional view of an exemplary fence 262. Fence 262 is a Faraday cage of printed circuit board vias and facilitates trapping EMI and sinking away induced EMI from external sources. More particularly, fence 262 includes a plurality of vias 405 that couple one or more ground planes 410 of circuit board 215 and/or copper pour 255 through layers 415, e.g., of substrate, of circuit board 215. Each of the plurality of vias 405 are positioned proximately to each other and may be positioned at pre-determined distances with respect to each other or in pre-determined arrangements in order to block particular wavelengths of EMI. For example, vias 405 may be positioned in two or more transverse rows.

Dam wall 256 (shown in FIG. 3) is positioned adjacent to copper pour 255 and fence 262. More particularly, dam wall 256 is coupled to circuit board 215 using one or more mechanical fasteners 264 (e.g., screws, rivets, etc.) such that a flange 266 of dam wall 256 is electrically coupled with copper pour 255. In the exemplary embodiment, flange 266 is positioned along transverse axis 257 and is parallel to copper pour 255 and fence 262. Flange 266 is substantially in contact with copper pour 255 along length 268. Dam wall 256 partially defines and encloses housing 230 opposite rear wall 232. Dam wall 256 is sized to be adjacent to flanges 246 of walls 238, 240, and 242. Dam wall 256 may be sheet metal or any other material capable of blocking or reducing EMI as described herein. In the exemplary embodiment, dam wall 256 includes a lip 270 that extends towards front portion 205 parallel to flange 266. Lip 270 may include one or more brackets 272 that extend towards front portion 205. Lip 270 and/or brackets 272 may be used to support a cover (not shown) for I/O module 130.

Because I/O modules 130 are in flow communication with the external environment, EMI is likely. EMI dam 228 facilitates reducing EMI from being emitted from or accepted into monitoring system 100. More particularly, housing 230 (including dam wall 256), copper pour 255, and fence 262 facilitate blocking and/or reducing EMI in cavity 124. By reducing the transmission of EMI in cavity 124, components of monitoring system 100, including backplane 104 and modules 116, are exposed to less EMI and less EMI is emitted from monitoring system 100.

Figure 5:
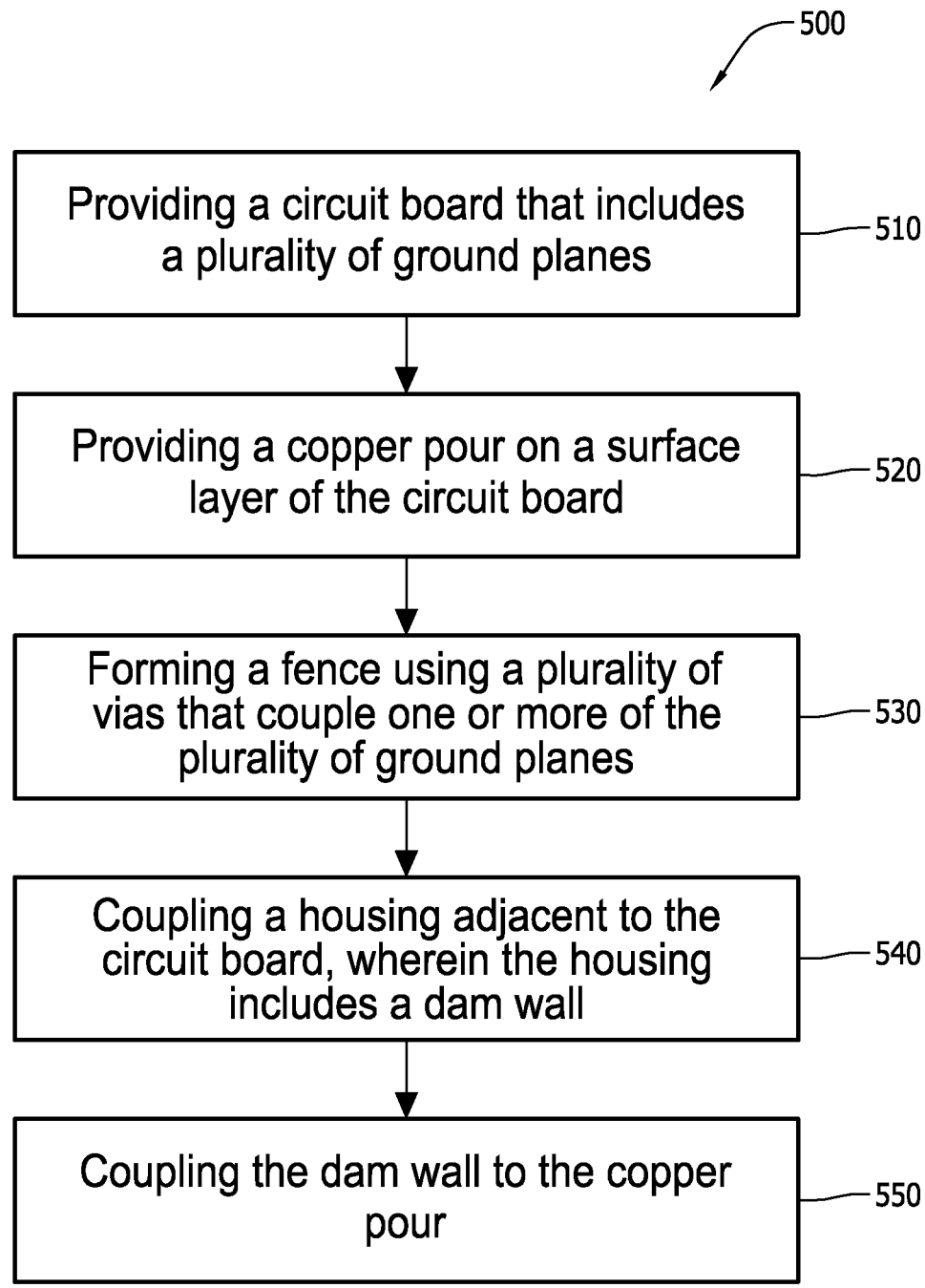
FIG. 5 is a flowchart illustrating an exemplary method that may be used for assembling the I/O module in FIGS. 2 and 3.

FIG. 5 is a flowchart 500 illustrating an exemplary method that may be used for assembling I/O module 130. A circuit board is provided 510 that includes a plurality of ground planes. Each ground plane is a layer of the circuit board. The circuit board may be coupled to a support wall. A copper pour is provided 520 on a surface layer of the circuit board. The copper pour extends transversely across the surface layer. A fence is formed 530 in the circuit board using a plurality of vias that couple two or more of the plurality of ground planes and/or the copper pour. A housing is coupled 540 adjacent to the circuit board, e.g. to support wall 213 coupled to circuit board 215. The housing includes a dam wall. The dam wall is coupled 550 to the copper pour.

Although an I/O module is used as an example throughout, it is contemplated that the structures and methods described herein for reducing EMI may be applied to a variety of systems, apparatus, and methods in a variety of fields not limited to monitoring systems and I/O modules.

The above-described systems enable a monitoring system to monitor a machine via one or more modules and I/O modules. More particularly, the I/O modules described herein facilitate reducing the transmission of EMI to, from, and/or through the monitoring system. The I/O modules are exposed to an external environment and, accordingly, EMI. To shield the internal components of the monitoring system from EMI and reduce emissions of EMI from internal components, the I/O modules include an EMI dam. The EMI dam includes a housing, a copper pour, and an EMI fence. The EMI fence includes a plurality of vias that couple two or more ground planes of a circuit board. The EMI fence is positioned below a copper pour on the surface of the circuit board. The housing includes a dam wall that is coupled to the copper pour.

Exemplary embodiments of an I/O module and a method for assembling an I/O module are described above in detail. The method, I/O module, and monitoring system are not limited to the specific embodiments described herein, but rather, components of the systems and/or steps of the method may be utilized independently and separately from other components and/or steps described herein. For example, the EMI dam may also be used in combination with other electronic systems and methods, and is not limited to practice with only the monitoring system or I/O module as described herein. Rather, the exemplary embodiments can be implemented and utilized in connection with many other power system applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A module for use with a monitoring system, comprising:
    a circuit board, comprising:
        a plurality of substrate layers;
        a plurality of ground plane layers, wherein a first substrate layer of the plurality of substrate layers separates at least two of the plurality of ground plane layers; and
        a plurality of vias, wherein the at least two of the plurality of ground plane layers are coupled to at least one of the plurality of vias;
    a copper pour disposed on a surface of the circuit board along a transverse axis of the surface, wherein the copper pour is coupled to the plurality of ground planes using the plurality of vias; and
    a housing comprising a dam wall configured to enclose one side of at least one external connector disposed within the housing, wherein the dam wall is configured to shield the monitoring system from electromagnetic interference associated with the at least one external connector, wherein the dam wall comprises a flange portion and a wall portion, wherein the flange portion is coupled to the copper pour along the transverse axis, is substantially parallel with the circuit board, and is substantially perpendicular to the wall portion.

2. The module of claim 1, wherein the housing further comprises a rear wall.

3. The module of claim 2, wherein the rear wall comprises at least one opening for the at least one external connector.

4. The module of claim 1, comprising a backplane connector.

5. The module of claim 1, comprising a wall coupled to the circuit board.

6. The module of claim 5, wherein the housing is coupled to the wall.

7. The module of claim 1, wherein the housing comprises at least one finger stock gasket.

8. A monitoring system comprising:
    a backplane; and
    a module coupled to the backplane comprising:
        a circuit board comprising:
            a plurality of substrate layers;
            a plurality of ground plane layers, wherein a first substrate layer of the plurality of substrate layers separates at least two of the plurality of ground plane layers; and
            a plurality of vias, wherein the at least two of the plurality of ground plane layers are coupled to at least one of the plurality of vias;
        a copper pour disposed along a surface of the circuit board along a transverse axis of the surface, wherein the copper pour is coupled to the plurality of ground planes using the plurality of vias; and
        a housing comprising a dam wall configured to enclose one side of at least one external connector disposed within the housing, wherein the dam wall is configured to shield the monitoring system from electromagnetic interference associated with the at least one external connector, wherein the dam wall comprises a flange portion and a wall portion, wherein the flange portion is coupled to the copper pour along the transverse axis, is substantially parallel with the circuit board, and is substantially perpendicular to the wall portion.

9. The monitoring system of claim 8, wherein the housing comprises a rear wall.

10. The monitoring system of claim 9, wherein the rear wall comprises at least one opening for the at least one external connector.

11. The monitoring system of claim 8, wherein the module comprises a backplane connector configured to couple the module to the backplane.

12. The monitoring system of claim 8, comprising a wall coupled to the circuit board.

13. The monitoring system of claim 12, wherein the housing is coupled to the wall.

14. The monitoring system of claim 8, wherein the housing comprises at least one finger stock gasket.

15. A method for assembling a module, comprising:
    assembling a circuit board comprising:
        a plurality of substrate layers;
        a plurality of ground plane layers, wherein a first substrate layer of the plurality of substrate layers separates at least two of the plurality of ground plane layers; and
        a plurality of vias, wherein the at least two of the plurality of ground plane layers are coupled to at least one of the plurality of vias;
    disposing a copper pour on a surface of the circuit board along a transverse axis of the surface;
    coupling the copper pour to the plurality of ground plane layers using the plurality of vias;

fastening a housing adjacent to the circuit board, wherein the housing comprises a dam wall configured to enclose one side of at least one external connector disposed within the housing, wherein the dam wall is configured to shield the module from electromagnetic interference associated with the at least one external connector, and wherein the dam wall comprises a flange portion and a wall portion; and coupling the flange portion of the dam wall to the copper pour along the transverse axis, wherein the flange portion is substantially parallel with the circuit board and substantially perpendicular to the wall portion.

16. The method of claim 15, comprising coupling the at least one external connector to the circuit board.

17. The method of claim 15, comprising coupling a backplane connector to the circuit board.

* * * * *